(12) United States Patent
Wang

(10) Patent No.: US 11,581,867 B2
(45) Date of Patent: Feb. 14, 2023

(54) BULK ACOUSTIC WAVE FILTER AND MANUFACTURING METHOD THEREOF, COMMUNICATION DEVICE

(71) Applicant: Newsonic Technologies, Guangdong (CN)

(72) Inventor: Jian Wang, Guangdong (CN)

(73) Assignee: Newsonic Technologies, Shenzhen (CN)

( * ) Notice: Subject to any disclaimer, the term of this patent is extended or adjusted under 35 U.S.C. 154(b) by 0 days.

(21) Appl. No.: 17/874,959

(22) Filed: Jul. 27, 2022

(65) Prior Publication Data
US 2022/0360248 A1 Nov. 10, 2022

(30) Foreign Application Priority Data
Apr. 1, 2022 (CN) .......................... 202210335503.9

(51) Int. Cl.
| | | |
|---|---|---|
| *H03H 9/05* | (2006.01) | |
| *H03H 9/02* | (2006.01) | |
| *H03H 9/10* | (2006.01) | |
| *H03H 9/13* | (2006.01) | |
| *H03H 9/15* | (2006.01) | |

(52) U.S. Cl.
CPC ...... *H03H 9/0514* (2013.01); *H03H 9/02007* (2013.01); *H03H 9/105* (2013.01); *H03H 9/131* (2013.01); *H03H 9/132* (2013.01); *H03H 9/15* (2013.01)

(58) Field of Classification Search
CPC .. H03H 9/131; H03H 9/02007; H03H 9/0514; H03H 9/105; H03H 9/132; H03H 9/15

USPC .................................................. 333/187, 188
See application file for complete search history.

(56) References Cited

U.S. PATENT DOCUMENTS 11,206,008 B2 * 12/2021 Dogiamis ................ H03H 9/10

FOREIGN PATENT DOCUMENTS

| CN | 110289825 A | 9/2019 |
| CN | 111327296 A | 6/2020 |
| CN | 113364425 A | 9/2021 |

OTHER PUBLICATIONS

Office action issued in corresponding Chinese application No. 202210335503.9, dated Dec. 5, 2022.

* cited by examiner

*Primary Examiner* — Samuel S Outten
*Assistant Examiner* — Jorge L Salazar, Jr.
(74) *Attorney, Agent, or Firm* — Leason Ellis LLP

(57) ABSTRACT

A bulk acoustic wave filter, a manufacturing method thereof, and a communication device are disclosed. The bulk acoustic wave filter includes a first filter substrate and a second filter substrate; the first filter substrate includes a first base substrate and a first resonator, a first electrode pad and a first auxiliary pad arranged on the first base substrate; the second filter substrate includes a second base substrate and a second resonator, a second electrode pad and a second auxiliary pad arranged on the second base substrate, the first filter substrate is arranged opposite to the second filter substrate, the first electrode pad and the second auxiliary pad are in contact with each other, and the second electrode pad and the first auxiliary pad are in contact with each other.

20 Claims, 6 Drawing Sheets

BULK ACOUSTIC WAVE FILTER AND MANUFACTURING METHOD THEREOF, COMMUNICATION DEVICE

CROSS REFERENCE TO RELATED APPLICATIONS

The present application claims priority of China Patent application No. 202210335503.9 filed on Apr. 1, 2022, the content of which is incorporated in its entirety as portion of the present application by reference herein.

TECHNICAL FIELD

Embodiments of the present disclosure relate to a bulk acoustic wave filter and a manufacturing method thereof, and a communication device.

BACKGROUND

With the continuous development of 5G technology, the application and demand of radio frequency filter are continuously upgraded, and the requirements for the performance indicators of the radio frequency filter are getting higher and higher. Generally, according to the transmission mode of the sound wave of the radio frequency filter, the radio frequency filter is divided into: a bulk acoustic wave filter and a surface acoustic wave filter.

The working frequency of the surface acoustic wave filter is generally below 2.5 GHz, and the working frequency of the bulk acoustic wave filter is generally between 1.5 GHz and 10 GHz. In contrast, the bulk acoustic wave filter comprises a higher working frequency; in addition, the bulk acoustic wave filter further comprises the advantages of insensitivity to temperature changes, low insertion loss, high quality factor (Q), strong power tolerance, and high reliability.

SUMMARY

Embodiments of the present disclosure relate to a bulk acoustic wave filter and a manufacturing method thereof, and a communication device. The bulk acoustic wave filter includes a first filter substrate and a second filter substrate; the first filter substrate includes a first base substrate and a first resonator, a first electrode pad and a first auxiliary pad arranged on the first base substrate; the second filter substrate includes a second base substrate and a second resonator, a second electrode pad and a second auxiliary pad arranged on the second base substrate; the first filter substrate is arranged opposite to the second filter substrate, the first electrode pad and the second auxiliary pad are in contact with each other, and the second electrode pad and the first auxiliary pad are in contact with each other; a sum of a distance between a surface of the first electrode pad away from the first base substrate and a first back surface of the first base substrate away from the second base substrate and a distance between a surface of the second auxiliary pad away from the second base substrate and a second back surface of the second base substrate away from the first base substrate is greater than a sum of a first distance between a surface of the first resonator away from the first base substrate and the first back surface of the first base substrate and a second distance between a surface of the second resonator away from the second base substrate and the second back surface of the second base substrate, a sum of a distance between a surface of the second electrode pad away from the second base substrate and the second back surface of the second base substrate and a distance between a surface of the first auxiliary pad away from the first base substrate and the first back surface of the first base substrate is greater than the sum of the first distance and the second distance. In this way, in the bulk acoustic wave filter, the two filter substrates are arranged opposite to each other, and a cavity between the two filter substrates is formed by utilizing the electrode pads and the auxiliary pads. On the one hand, the bulk acoustic wave filter makes the first filter substrate serve as a package cover for the second filter substrate, and the second filter substrate serves as a package cover for the first filter substrate, therefore, it is not needed to introduce other packaging structures such as additional cover wafers, bonded organic films or organic dry films to implement packaging, thereby greatly reducing the manufacturing cost of the bulk acoustic wave filter. On the other hand, the bulk acoustic wave filter integrates two filter substrates into one, so as to provide filter products of two frequency bands, so has a high degree of integration, and can also reduce a volume of a radio frequency front-end module using a plurality of filters.

At least one embodiment of the present disclosure provides a bulk acoustic wave filter, which includes: a first filter substrate, comprising a first base substrate and a first resonator, a first electrode pad and a first auxiliary pad arranged on the first base substrate; and a second filter substrate, comprising a second base substrate and a second resonator, a second electrode pad and a second auxiliary pad arranged on the second base substrate, the first filter substrate is arranged opposite to the second filter substrate, the first electrode pad and the second auxiliary pad are in contact with each other, and the second electrode pad and the first auxiliary pad are in contact with each other, a sum of a distance between a surface of the first electrode pad away from the first base substrate and a first back surface of the first base substrate away from the second base substrate and a distance between a surface of the second auxiliary pad away from the second base substrate and a second back surface of the second base substrate away from the first base substrate is greater than a sum of a first distance between a surface of the first resonator away from the first base substrate and the first back surface of the first base substrate and a second distance between a surface of the second resonator away from the second base substrate and the second back surface of the second base substrate, a sum of a distance between a surface of the second electrode pad away from the second base substrate and the second back surface of the second base substrate and a distance between a surface of the first auxiliary pad away from the first base substrate and the first back surface of the first base substrate is greater than the sum of the first distance and the second distance.

For example, in the bulk acoustic wave filter provided by an embodiment of the present disclosure, the first resonator and the second resonator are spaced apart in a direction perpendicular to the first base substrate.

For example, in the bulk acoustic wave filter provided by an embodiment of the present disclosure, the distance between the surface of the first electrode pad away from the first base substrate and the first back surface of the first base substrate and the distance between the surface of the first auxiliary pad away from the first base substrate and the first back surface of the first base substrate are both greater than the first distance.

For example, in the bulk acoustic wave filter provided by an embodiment of the present disclosure, the distance between the surface of the first electrode pad away from the first base substrate and the first back surface of the first base substrate is equal to the distance between the surface of the first auxiliary pad away from the first base substrate and the first back surface of the first base substrate.

For example, in the bulk acoustic wave filter provided by an embodiment of the present disclosure, the distance between the surface of the second electrode pad away from the second base substrate and the second back surface of the second base substrate and the distance between the surface of the second auxiliary pad away from the second base substrate and the second back surface of the second base substrate are both greater than the second distance.

For example, in the bulk acoustic wave filter provided by an embodiment of the present disclosure, the distance between the surface of the second electrode pad away from the second base substrate and the second back surface of the second base substrate is equal to the distance between the surface of the second auxiliary pad away from the second base substrate and the second back surface of the second base substrate.

For example, in the bulk acoustic wave filter provided by an embodiment of the present disclosure, the first resonator comprises a first piezoelectric layer, a first upper electrode and a first lower electrode, the first base substrate comprises a first groove, the first piezoelectric layer spans the first groove, the first lower electrode is arranged on a side of the first piezoelectric layer close to the first base substrate, and the first upper electrode is arranged on a side of the first piezoelectric layer away from the first lower electrode.

For example, in the bulk acoustic wave filter provided by an embodiment of the present disclosure, a thickness of the first electrode pad and a thickness of the first auxiliary pad are both greater than a thickness of the first upper electrode.

For example, in the bulk acoustic wave filter provided by an embodiment of the present disclosure, the second resonator comprises a second piezoelectric layer, a second upper electrode and a second lower electrode, the second base substrate comprises a second groove, the second piezoelectric layer spans the second groove, and the second lower electrode is arranged on a side of the second piezoelectric layer close to the second base substrate, and the second upper electrode is arranged on a side of the second piezoelectric layer away from the second lower electrode.

For example, in the bulk acoustic wave filter provided by an embodiment of the present disclosure, a thickness of the second electrode pad and a thickness of the second auxiliary pad are both greater than a thickness of the second upper electrode.

For example, in the bulk acoustic wave filter provided by an embodiment of the present disclosure, the first base substrate comprises a first resonator region and a first pad region arranged around the first resonator region, and the first resonator is arranged in the first resonator region, the first electrode pad and the first auxiliary pad are arranged in the first pad region, the second base substrate comprises a second resonator region and a second pad region arranged around the second resonator region, the second resonator is arranged in the second resonator region, and the second electrode pad and the second auxiliary pad are arranged in the second pad region.

For example, in the bulk acoustic wave filter provided by an embodiment of the present disclosure, an orthographic projection of the second pad region on the first base substrate overlaps with the first pad region.

For example, in the bulk acoustic wave filter provided by an embodiment of the present disclosure, the first base substrate is a wafer, and the second base substrate is a wafer.

For example, in the bulk acoustic wave filter provided by an embodiment of the present disclosure, an orthographic projection of the second resonator on the first base substrate overlaps with an orthographic projection of the first resonator on the first base substrate.

For example, in the bulk acoustic wave filter provided by an embodiment of the present disclosure, an orthographic projection of the second electrode pad on the first base substrate overlaps with an orthographic projection of the first auxiliary pad on the first base substrate, and an orthographic projection of the second auxiliary pad on the first base substrate overlaps with an orthographic projection of the first electrode pad on the first base substrate.

For example, in the bulk acoustic wave filter provided by an embodiment of the present disclosure, the first filter substrate further comprises a first sealing structure, arranged around the first resonator, the first electrode pad and the first auxiliary pad; the second filter substrate further comprises a second sealing structure, arranged around the second resonator, the second electrode pad and the second auxiliary pad, and the second sealing structure is arranged in contact with the first sealing structure.

For example, in the bulk acoustic wave filter provided by an embodiment of the present disclosure, the first sealing structure, the first electrode pad and the first auxiliary pad are formed on a same conductive layer and in a same patterning process, the second sealing structure, the second electrode pad and the second auxiliary pad are formed on a same conductive layer and in a same patterning process.

For example, in the bulk acoustic wave filter provided by an embodiment of the present disclosure, the second base substrate comprises a plurality of through holes penetrating the second base substrate, the bulk acoustic wave filter further comprises an electrical connection layer, which is at least partially arranged within the plurality of through holes, orthographic projections of the plurality of through holes on the second base substrate overlap with orthographic projections of the second electrode pads and the second auxiliary pads on the second base substrate, the electrical connection layer is connected to the second electrode pad and the second auxiliary pad.

For example, in the bulk acoustic wave filter provided by an embodiment of the present disclosure, the bulk acoustic wave filter further comprises a passivation layer, arranged on a side of the electrical connection layer away from the second base substrate, which comprises a passivation layer opening, the passivation layer opening exposing part of the electrical connection layer; and a solder ball, connected to the electrical connection layer through the passivation layer opening.

At least one embodiment of the present disclosure further provides a communication device, which includes any one of the abovementioned the bulk acoustic wave filter.

At least one embodiment of the present disclosure further provides a manufacturing method of a bulk acoustic wave filter, which includes: forming a first filter substrate, the first filter substrate comprises a first base substrate and a first resonator, a first electrode pad and a first auxiliary pad arranged on the first base substrate; forming a second filter substrate, the second filter substrate comprises a second base substrate, a second resonator, a second electrode pad and a second auxiliary pad arranged on the second base substrate; and combining the first filter substrate and the second filter substrate, so as to form a cavity between the first filter substrate and the second filter substrate, a sum of a distance between a surface of the first electrode pad away from the first base substrate and a first back surface of the first base substrate away from the second base substrate and a distance between a surface of the second auxiliary pad away from the second base substrate and a second back surface of the second base substrate away from the first base substrate is greater than a sum of a first distance between a surface of the first resonator away from the first base substrate and a first back surface of the first base substrate and a second distance between a surface of the second resonator away from the second base substrate and a second back surface of the second base substrate, a sum of the distance between a surface of the second electrode pad away from the second base substrate and a second back surface of the second base substrate and a distance between a surface of the first auxiliary pad away from the first base substrate and a second back surface of the second base substrate is greater than a sum of the first distance and the second distance.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1:
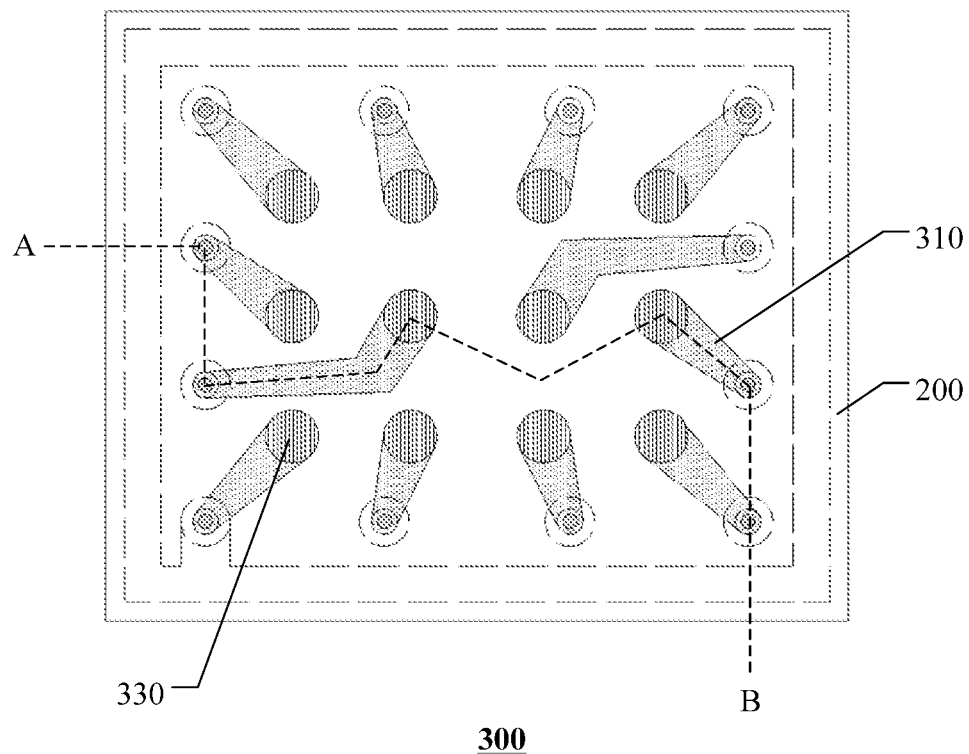
FIG. 1 is a schematic plan view of a bulk acoustic wave filter according to an embodiment of the present disclosure.

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. Terms like "connected" or "connected" are not limited to physical or mechanical connections, but can include electrical connections, whether direct or indirect.

Unless otherwise defined, the features such as parallel, vertical and identical used in the embodiments of the present disclosure all include cases such as parallel, vertical and identical in the strict sense, and cases such as approximately parallel, approximately vertical and approximately identical with certain errors. For example, the above-mentioned "approximately" can refer to that the difference of the compared objects is within 10% or 5% of the average value of the compared objects. When the number of a component or element is not specifically indicated hereinafter in the embodiments of the present disclosure, it refers to that the component or element can be one or more, or can be understood as at least one. "At least one" refers to one or more, and "a plurality of" refers to at least two. The expression "same layer" in the disclosed embodiment refers to the relationship between a plurality of film layers formed by the same material after the same step (for example, one-step patterning process). The "same layer" here does not always refer to that the thickness of multiple film layers is the same or the height of multiple film layers in the cross-sectional view is the same.

During research, inventor(s) of the present application noticed that, for a BAW filter (bulk acoustic wave filter), it is usually needed to form a cavity over the working area of the BAW filter through a packaging process (e.g., wafer level packaging). The packaging process for forming the cavity generally includes the following types.

(1) Making a silicon cap wafer (Silicon Cap Wafer) with a groove structure; forming a metal bonding layer on the silicon cap wafer; bonding the silicon cap wafer to the filter wafer through a metal bonding layer (a filter and a metal bonding layer are manufactured on the filter wafer), so that the cavity is formed above the functional area of the filter wafer by using the groove structure of the silicon cap wafer; forming a through hole in the silicon cap wafer; connecting an electrode pad on the filter wafer to external circuits through the above-mentioned through hole.

In this packaging process, the silicon cap wafer needs to use a high-resistance silicon wafer, and the high-resistance silicon wafer is relatively expensive, therefore the cost of this packaging process is relatively high.

(2) forming a first organic dry film (Dry film) on the filter wafer; patterning the first organic dry film to form an opening over the functional areas of the filter wafer, and forming a first through hole in the first organic dry film, and arranging the first through hole corresponding to the electrode pad of the filter wafer; forming a second organic dry film on one side of the first organic dry film away from the filter wafer; patterning the second organic dry film so as to cover the above-mentioned opening, thereby forming the cavity above the functional area of the filter wafer, and forming a second through hole in the second organic dry film, and arranging the second through hole corresponding to the first through hole; connecting the electrode pad on the filter wafer to the external circuit through the first through hole and the second through hole.

In this packaging process, two layers of organic dry films are used, and the materials of the organic dry films are expensive; therefore, the cost of the packaging process is relatively high.

(3) boning an organic layer on a silicon cap wafer; patterning the bonding organic layer, to form a first opening at a position corresponding to the functional area of the filter wafer, to form a second opening at a position corresponding to an electrode pad of the filter wafer; bonding the silicon cap wafer to the filter wafer to form a cavity over the functional area of the filter wafer by using the first opening; forming a through hole on the silicon cap wafer, and arranging the through hole corresponding to the second opening; connecting the electrode pad on the filter wafer to the external circuit through the through hole on the silicon cap wafer and the second through hole.

In this packaging process, the silicon cap wafer also needs to use the high-resistance silicon wafer, and the high-resistance silicon wafer is relatively expensive; in addition, the bonding organic layer is also a relatively expensive material, therefore the cost of this packaging process is relatively higher.

It can be seen that the cost of the packaging process of the usual bulk acoustic wave filter is relatively high, which affects the large-scale application of the bulk acoustic wave filter. On the other hand, with the continuous development of communication technology, higher requirements are further put forward for miniaturization and integration of the bulk acoustic wave filter.

In this regard, embodiments of the present disclosure relate to a bulk acoustic wave filter and a manufacturing method thereof, and a communication device. The bulk acoustic wave filter includes a first filter substrate and a second filter substrate; the first filter substrate includes a first base substrate and a first resonator, a first electrode pad and a first auxiliary pad arranged on the first base substrate; the second filter substrate includes a second base substrate and a second resonator, a second electrode pad and a second auxiliary pad arranged on the second base substrate; the first filter substrate is arranged opposite to the second filter substrate, the first electrode pad and the second auxiliary pad are in contact with each other, and the second electrode pad and the first auxiliary pad are in contact with each other; a sum of a distance between a surface of the first electrode pad away from the first base substrate and a first back surface of the first base substrate away from the second base substrate and a distance between a surface of the second auxiliary pad away from the second base substrate and a second back surface of the second base substrate away from the first base substrate is greater than a sum of a first distance between a surface of the first resonator away from the first base substrate and the first back surface of the first base substrate and a second distance between a surface of the second resonator away from the second base substrate and the second back surface of the second base substrate, a sum of a distance between a surface of the second electrode pad away from the second base substrate and the second back surface of the second base substrate and a distance between a surface of the first auxiliary pad away from the first base substrate and the first back surface of the first base substrate is greater than the sum of the first distance and the second distance. In this way, in the bulk acoustic wave filter, the two filter substrates are arranged opposite to each other, and a cavity between the two filter substrates is formed by utilizing the electrode pads and the auxiliary pads. On the one hand, the bulk acoustic wave filter makes the first filter substrate serve as a package cover for the second filter substrate, and the second filter substrate serves as a package cover for the first filter substrate, therefore, it is not needed to introduce other packaging structures such as additional cover wafers, bonded organic films or organic dry films to implement packaging, thereby greatly reducing the manufacturing cost of the bulk acoustic wave filter. On the other hand, the bulk acoustic wave filter integrates two filter substrates into one, so as to provide filter products of two frequency bands, so has a high degree of integration, and can also reduce a volume of a radio frequency front-end module using a plurality of filters.

Hereinafter, the bulk acoustic wave filter and the manufacturing method thereof, and the communication device provided by the embodiments of the present disclosure will be described in detail with reference to the accompanying drawings.

Figure 2:
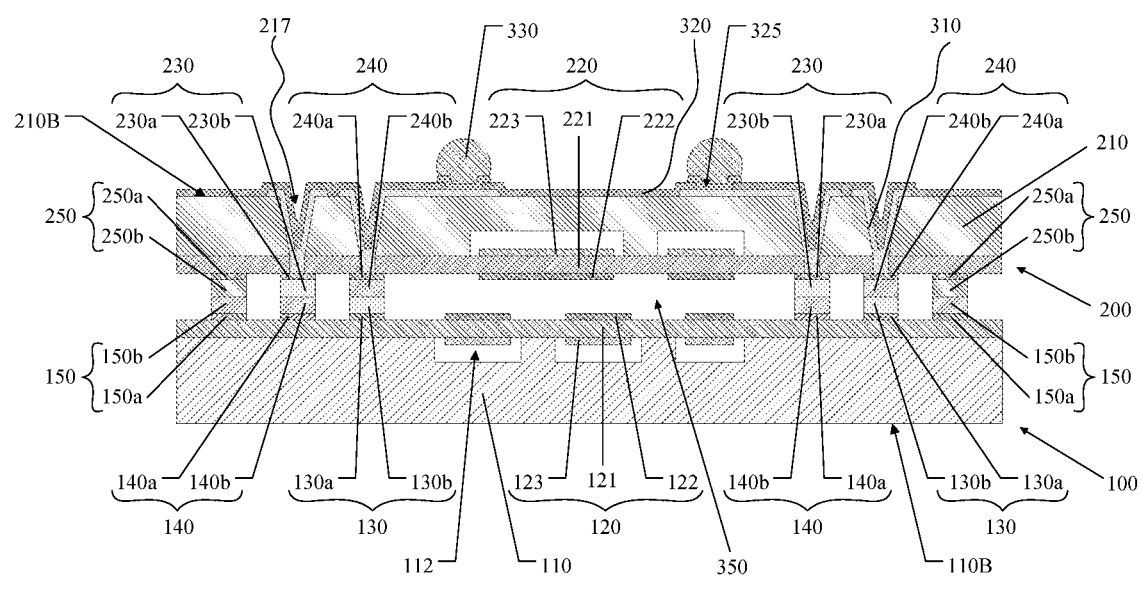
FIG. 2 is a schematic cross-sectional view of the bulk acoustic wave filter taken along line A-B in FIG. 1.
Figure 3:
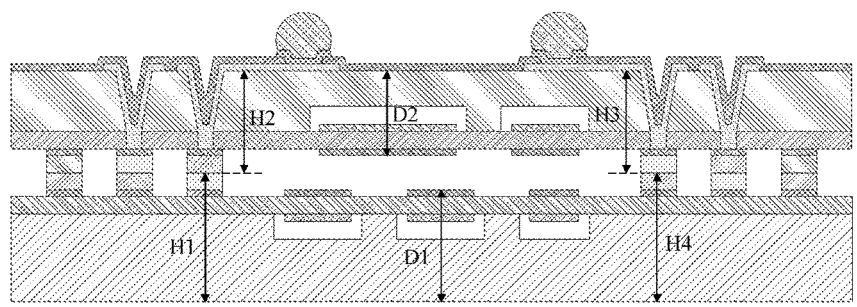
FIG. 3 is a schematic diagram of relative sizes in a bulk acoustic wave filter according to an embodiment of the present disclosure.

An embodiment of the present disclosure provides a bulk acoustic wave filter. FIG. 1 is a schematic plan view of a bulk acoustic wave filter according to an embodiment of the present disclosure; FIG. 2 is a schematic cross-sectional view of the bulk acoustic wave filter taken along line A-B in FIG. 1; FIG. 3 is a schematic diagram of relative sizes in a bulk acoustic wave filter according to an embodiment of the present disclosure.

As illustrated by FIG. 1 and FIG. 2, a bulk acoustic wave filter 300 includes a first filter substrate 100 and a second filter substrate 200; the first filter substrate 100 includes a first base substrate 110 and a first resonator 120, a first electrode pad 130 and a first auxiliary pad 140 arranged on the first base substrate 110; the second filter substrate 200 includes a second base substrate 210 and a second resonator 220, a second electrode pad 230 and a second auxiliary pad 240 arranged on the second base substrate 210. It should be noted that the above-mentioned first electrode pad 130 and second electrode pad 230 can be used for inputting electrical signals, outputting electrical signals or grounding.

As illustrated by FIG. 1 and FIG. 2, the first filter substrate 100 is arranged opposite to the second filter substrate 200, the first electrode pad 130 and the second auxiliary pad 240 are in contact with each other, and the second electrode pad 230 and the first auxiliary pad 140 are in contact with each other; therefore, the first electrode pad 130 and the second auxiliary pad 240 for example are used to support a space between the first filter substrate 100 and the second filter substrate 200, and the second electrode pad 230 and the first auxiliary pad 140 for example are used to support the space between the first filter substrate 100 and the second filter substrate 200, thereby forming a cavity 350.

At this time, as illustrated by FIG. 3, a sum of a distance H1 between a surface of the first electrode pad 130 away from the first base substrate 110 and a first back surface 110B of the first base substrate 110 away from the second base substrate 210 and a distance H2 between a surface of the second auxiliary pad 240 away from the second base substrate 210 and a second back surface 210B of the second base substrate 210 away from the first base substrate 110 is greater than a sum of a first distance D1 between a surface of the first resonator 120 away from the first base substrate 110 and the first back surface 110B of the first base substrate 110 and a second distance D2 between a surface of the second resonator 220 away from the second base substrate 210 and the second back surface 210B of the second base substrate 210, that is: H1+H2>D1+D2. A sum of a distance H3 between a surface of the second electrode pad 230 away from the second base substrate 210 and the second back surface 210B of the second base substrate 210 and a distance H4 between a surface of the first auxiliary pad 140 away from the first base substrate 110 and the second back surface 210B of the second base substrate 210 is greater than the sum of the first distance D1 and the second distance D2, that is: H3+H4>D1+D2.

In the bulk acoustic wave filter provided by an embodiment of the present disclosure, a first bulk acoustic wave filter and a second bulk acoustic wave filter are arranged opposite to each other, a first bulk acoustic wave filter is arranged opposite to a second bulk acoustic wave filter, the first electrode pad and the second auxiliary pad are in contact with each other, and the second electrode pad and the first auxiliary pad are in contact with each other, and the height H1 of the first electrode pad relative to the first back surface and the height H2 of the second auxiliary pad relative to the second back surface satisfy: H1+H2>D1+D2, the height H3 of the second electrode pad relative to the second back surface and the height H4 of the first auxiliary pad relative to the first back surface satisfy: H3+H4>D1+D2. Therefore, the first electrode pad and the second auxiliary pad can support and maintain the space between the first filter substrate and the second filter substrate, and the second electrode pad and the first auxiliary pad can support and maintain the space between the first filter substrate and the second filter substrate, thereby forming a cavity between the first filter substrate and the second filter substrate. On the one hand, the bulk acoustic wave filter makes the first filter substrate serve as a package cover for the second filter substrate, and the second filter substrate serves as a package cover for the first filter substrate, therefore, it is not needed to introduce other packaging structures for example additional cover wafers, bonded organic films or organic dry films to implement packaging, thereby greatly reducing the manufacturing cost of the bulk acoustic wave filter. On the other hand, the bulk acoustic wave filter integrates two filter substrates into one, so as to provide filter products of two frequency bands, so has a high degree of integration, and can also reduce a volume of a radio frequency front-end module using a plurality of filters. In addition, because the first filter substrate is provided with the first auxiliary pad in addition to the first electrode pad, and the second filter substrate is further provided with the second auxiliary pad in addition to the second electrode pad, the bulk acoustic wave filter actually increases the number of pads on the first filter substrate and the second filter substrate and the number of through holes or a solder ball for electrical connection to outside, thereby improving the thermal conductivity of the bulk acoustic wave filter.

In some embodiments, as illustrated by FIG. 2, the first base substrate 110 is a silicon wafer, and the second base substrate 210 is a silicon wafer. Of course, the embodiments of the present disclosure include, but are not limited to thereto, the first base substrate and the second base substrate for example are made of other materials.

In some embodiments, as illustrated by FIG. 2, an orthographic projection of the second resonator 220 on the first base substrate 110 overlaps with an orthographic projection of the first resonator 120 on the first base substrate 110.

In some embodiments, as illustrated by FIG. 2, the first resonator 120 and the second resonator 220 are spaced apart in a direction perpendicular to the first base substrate 110; that is, the first resonator 120 and the second resonator 220 do not touch together.

In some embodiments, as illustrated by FIG. 1 and FIG. 2, an orthographic projection of the second electrode pad 230 on the first base substrate 110 overlaps with an orthographic projection of the first auxiliary pad 140 on the first base substrate 110, an orthographic projection of the second auxiliary pad 240 on the first base substrate 110 overlap with an orthographic projection of the first electrode pad 130 on the first base substrate 110.

In some embodiments, as illustrated by FIG. 1 and FIG. 2, the above-mentioned first filter substrate 100 for example includes a plurality of first resonators 120, a plurality of first electrode pads 130 and a plurality of first auxiliary pads 140; the above-mentioned second filter substrate 200 for example includes a plurality of second resonators 220, a plurality of second electrode pads 230 and a plurality of second auxiliary pads 240. It should be noted that the number of the first resonator, the number of the first electrode pad and the number of the first auxiliary pad on the first filter substrate are set according to actual needs; similarly, the number of the second electrode pad and the number of the second auxiliary pad can be set according to actual needs.

In some embodiments, as illustrated by FIG. 1 and FIG. 2, the above-mentioned first filter substrate 100 includes five first resonators 120, six first electrode pads 130 and five first auxiliary pads 140; the above-mentioned second filter substrate 200 also includes five second resonators 220, five second electrode pads 230 and six second auxiliary pads 240.

In some embodiments, as illustrated by FIG. 2, the plurality of first electrode pads 130 on the first filter substrate 100 and the plurality of second auxiliary pads 240 on the second filter substrate 200 are arranged in a one-to-one correspondence; the plurality of second electrode pads 230 on the second filter substrate 200 and the plurality of first auxiliary pads 140 on the first filter substrate 100 are arranged in a one-to-one correspondence. At this time, the number of the first electrode pads is equal to the number of the second auxiliary pads, and the number of the second electrode pads is equal to the number of the first auxiliary pads.

In some embodiments, as illustrated by FIG. 2 and FIG. 3, the height H1 of the first electrode pad 130 relative to the first back surface 110B and the height H2 of the second auxiliary pad 240 relative to the second back surface 210B satisfy: H1+H2>D1+D2+2 μm, and the height H3 of the second electrode pad 230 relative to the second back surface 210B and the height H4 of the first auxiliary pad 140 relative to the first back surface 110B satisfy: H3+H4>D1+D2+2 μm. Therefore, the bulk acoustic wave filter can better prevent the first resonator and the second resonator from touching in the working state.

In some embodiments, as illustrated by FIG. 2, the distance H1 between the surface of the first electrode pad 130 away from the first base substrate 110 and the first back surface 110B of the first base substrate 110 and the distance H4 between the surface of the first auxiliary pad 140 away from the first base substrate 110 and the first back surface 110B of the first base substrate 110 are both greater than the first distance. Therefore, after the first filter substrate and the second filter substrate are vertically bonded, the first filter substrate and the second filter substrate better form the cavity between the first resonator and the second resonator.

In some embodiments, as illustrated by FIG. 2 and FIG. 3, the distance H3 between the surface of the second electrode pad 230 away from the second base substrate 210 and the second back surface 210B of the second base substrate 210 and the distance H2 between the surface of the second auxiliary pad 240 away from the second base substrate 210 and the second back surface 210B of the second base substrate 210 are both greater than the second distance.

Therefore, after the first filter substrate and the second filter substrate are vertically bonded, the first filter substrate and the second filter substrate better form the cavity between the first resonator and the second resonator.

In some embodiments, as illustrated by FIG. 2 and FIG. 3, the distance H1 between the surface of the first electrode pad 130 away from the first base substrate 110 and the first back surface 110B of the first base substrate 110 is equal to the distance H4 between the surface of the first auxiliary pad 140 away from the first base substrate 110 and the first back surface 110B of the first base substrate 110. In this way, on the one hand, all the first electrode pads and the second auxiliary pads are bonded or contacted, and all the second electrode pads and the first auxiliary pads are bonded or in contact with each other; On the one hand, the first electrode pad and the first auxiliary pad are formed on a same conductive layer and in a same patterning process, so that the manufacturing cost of the first electrode pad and the first auxiliary pad are reduced.

In some embodiments, as illustrated by FIG. 2, the distance H3 between the surface of the second electrode pad 230 away from the second base substrate 210 and the second back surface 210B of the second base substrate 210 is equal to the distance H2 between the surface of the second auxiliary pad 240 away from the second base substrate 210 and the second back surface 210B of the second base substrate 210. In this way, on the one hand, all the first electrode pads and the second auxiliary pads are bonded or in contact with each other, and all the second electrode pads and the first auxiliary pads are bonded or contacted; On the one hand, the second electrode pad and the second auxiliary pad are formed on a same conductive layer and in a same patterning process, so that the manufacturing cost of the second electrode pad and the second auxiliary pad are reduced.

In some embodiments, as illustrated by FIG. 2, the first resonator 120 includes a first piezoelectric layer 121, a first upper electrode 122 and a first lower electrode 123; the first base substrate 110 includes a first groove 112, the first groove 112 is recessed into the first base substrate 110 from the surface of the first base substrate 110 close to the second base substrate 210; the first piezoelectric layer 121 spans the first groove 112, the first lower electrode 123 is arranged on a side of the first piezoelectric layer 121 close to the first base substrate 110, and the first upper electrode 122 is arranged on a side of the first piezoelectric layer 121 away from the first lower electrode 123.

For example, the first lower electrode 123 is arranged within the first groove 112.

In some embodiments, as illustrated by FIG. 2, the entire first piezoelectric layer 121 is arranged on the first base substrate 110, which can save the patterning process and thus reduces the cost. At this time, both the first electrode pad 130 and the first auxiliary pad 140 are arranged on a side of the first piezoelectric layer 121 away from the first base substrate 110.

In some embodiments, as illustrated by FIG. 2, a thickness of the first electrode pad 130 and a thickness of the first auxiliary pad 140 are both greater than a thickness of the first upper electrode 122. Therefore, the bulk acoustic wave filter can ensure that the distance between the surface of the first electrode pad away from the first base substrate and the first back surface of the first base substrate and the distance between the surface of the first auxiliary pad away from the first base substrate and the first back surface of the first base substrate are both greater than the first distance.

In some embodiments, as illustrated by FIG. 2, the first electrode pad 130 includes a first sub-electrode layer 130a and a second sub-electrode layer 130b, and the second sub-electrode layer 130b is arranged on a side of the first sub-electrode layer 130a away from the first base substrate the substrate 110. The first sub-electrode layer 130a may be made of a material with better adhesion to the first base substrate 110 or the first piezoelectric layer 121, and the second sub-electrode layer 130b may be made of a material with better bonding properties.

For example, the first sub-electrode layer 130a is made of titanium (Ti) or chromium (Cr); the second sub-electrode layer 130b is made of a stacked structure of gold (Au), copper (Cu)/nickel (Ni)/gold (Au), or a stacked structure of copper (Cu)/tin (Sn).

In some embodiments, as illustrated by FIG. 2, the first auxiliary pad 140 includes a first sub-auxiliary layer 140a and a second sub-auxiliary layer 140b, and the second sub-auxiliary layer 140b is arranged on a side of the first sub-auxiliary layer 140a away from the first base substrate 110. The first sub-auxiliary layer 140a may be made of a material with better adhesion performance to the first base substrate 110 or the first piezoelectric layer 121, and the second sub-auxiliary layer 140b may be made of a material with better bonding performance.

For example, the first sub-auxiliary layer 140a is made of titanium (Ti) or chromium (Cr); the second sub-auxiliary layer 140b is made of a stacked structure of gold (Au), copper (Cu)/nickel (Ni)/gold (Au), or a stacked structure of copper (Cu)/tin (Sn).

In some embodiments, as illustrated by FIG. 2, the second resonator 220 includes a second piezoelectric layer 221, a second upper electrode 222 and a second lower electrode 223, the second base substrate 210 includes a second groove 212, the second groove 212 is recessed into the second base substrate 210 from the surface of the second base substrate 210 close to the first base substrate 110; the second piezoelectric layer 221 spans the second groove 212, and the second lower electrode 223 is arranged on a side of the second piezoelectric layer 221 close to the second base substrate 210, and the second upper electrode 222 is arranged on a side of the second piezoelectric layer 221 away from the second lower electrode 223.

For example, the second lower electrode 223 is located within the second groove 212.

In some embodiments, as illustrated by FIG. 2, a thickness of the second electrode pad 230 and a thickness of the second auxiliary pad 240 are both greater than a thickness of the second upper electrode 222. Therefore, the bulk acoustic wave filter can ensure that the distance between the surface of the second electrode pad away from the second base substrate and the second back surface of the second base substrate and the distance between the surface of the second auxiliary pad away from the second base substrate and the second back surface of the second base substrate are both greater than the first distance.

In some embodiments, as illustrated by FIG. 2, the second electrode pad 230 includes a third sub-electrode layer 230a and a fourth sub-electrode layer 230b, and the fourth sub-electrode layer 230b is arranged on a side of the third sub-electrode layer 230a away from the second base substrate 210. The third sub-electrode layer 230a may be made of a material with better adhesion performance to the second base substrate 210 or the second piezoelectric layer 221, and the fourth sub-electrode layer 230b may be made of a material with better bonding performance.

For example, the third sub-electrode layer 230a is made of titanium (Ti) or chromium (Cr); the fourth sub-electrode layer 230b is made of a stacked structure of gold (Au), copper (Cu)/nickel (Ni)/gold (Au), or a stacked structure of copper (Cu)/tin (Sn).

In some embodiments, as illustrated by FIG. 2, the second auxiliary pad 240 includes a third sub-auxiliary layer 240a and a fourth sub-auxiliary layer 240b, and the fourth sub-auxiliary layer 240b is arranged on a side of the third sub-auxiliary layer 240a away from the first base substrate 110. The third sub-auxiliary layer 240a may be made of a material with better adhesion to the second base substrate 210 or the second piezoelectric layer 221, and the fourth sub-auxiliary layer 240b may be made of a material with better bonding performance.

For example, the third sub-auxiliary layer 240a is made of titanium (Ti) or chromium (Cr); the fourth sub-auxiliary layer 240b is made of a stacked structure of gold (Au), copper (Cu)/nickel (Ni)/gold (Au), or a stacked structure of copper (Cu)/tin (Sn).

In some embodiments, as illustrated by FIG. 2, the second base substrate 210 includes a plurality of through holes 217 penetrating the second base substrate 210; the bulk acoustic wave filter 300 further includes an electrical connection layer 310, which is at least partially arranged within the plurality of through holes 217. Orthographic projections of the plurality of through holes 217 on the second base substrate 210 overlap with orthographic projections of the second electrode pads 230 and the second auxiliary pads 240 on the second base substrate 210. Therefore, the electrical connection layer 310 is connected to the second electrode pad 230 and the second auxiliary pad 240. It should be noted that although the second filter substrate illustrated in FIG. 2 is arranged above the first filter substrate, embodiments of the present disclosure include, but are not limited to thereto, the second filter substrate may also be arranged below the first filter substrate.

In some embodiments, as illustrated by FIG. 2, the bulk acoustic wave filter 300 further includes a passivation layer 320, arranged on a side of the electrical connection layer 310 away from the second base substrate 210 which includes a passivation layer opening 325, the passivation layer opening 325 exposing part of the electrical connection layer 310; and a solder ball, connected to the electrical connection layer 310 through the passivation layer opening 325.

Figure 4:
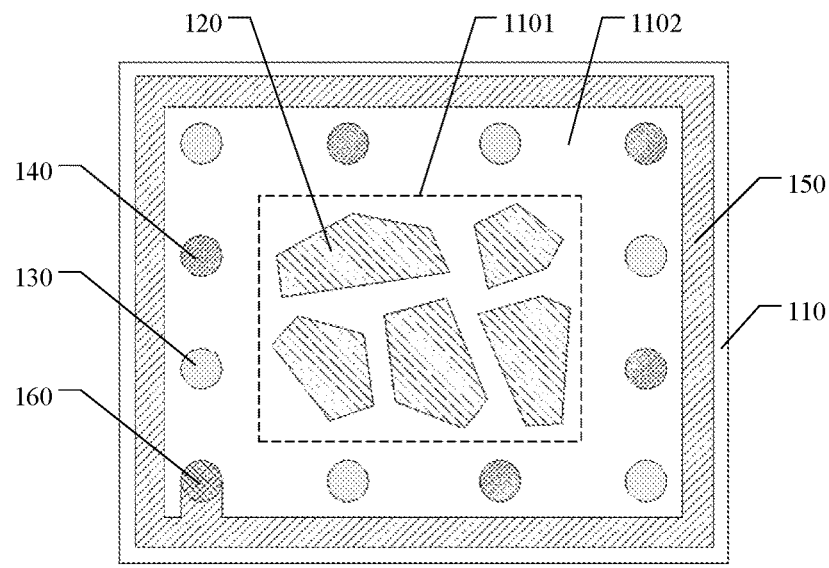
FIG. 4 is a schematic plan view of a first filter substrate in a bulk acoustic wave filter according to an embodiment of the present disclosure.
Figure 5:
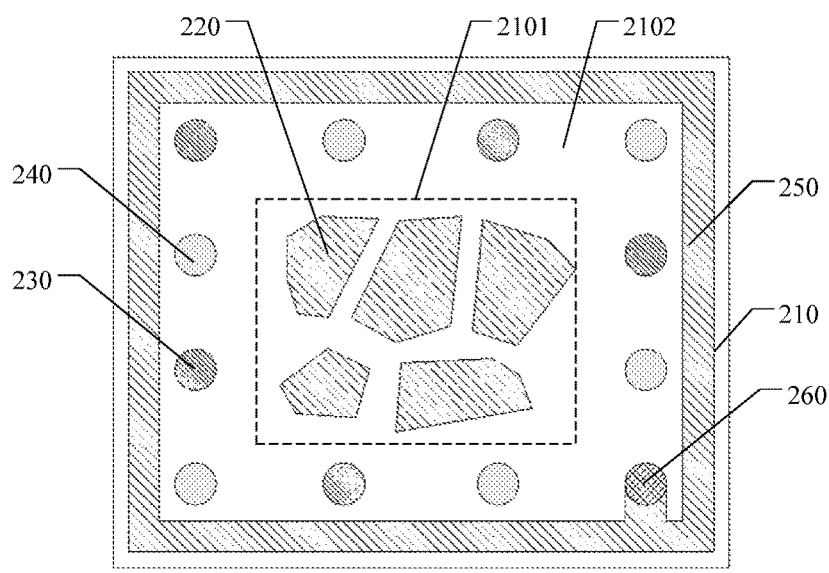
FIG. 5 is a schematic plan view of a second filter substrate in a bulk acoustic wave filter according to an embodiment of the present disclosure.

FIG. 4 is a schematic plan view of a first filter substrate in a bulk acoustic wave filter according to an embodiment of the present disclosure; FIG. 5 is a schematic plan view of a second filter substrate in a bulk acoustic wave filter according to an embodiment of the present disclosure.

As illustrated by FIG. 4 and FIG. 5, the first base substrate 110 includes a first resonator region 1101 and a first pad region 1102 arranged around the first resonator region 1101, and the first resonator 120 is arranged in the first resonator region 1101, the first electrode pad 130 and the first auxiliary pad 140 are arranged in the first pad region 1102; the second base substrate 210 includes a second resonator region 2101 and a second pad region 2102 arranged around the second resonator region 2101, the second resonator 220 is arranged in the second resonator region 2101, and the second electrode pad 230 and the second auxiliary pad 240 are arranged in the second pad region 2102.

In some embodiments, as illustrated by FIG. 2, an orthographic projection of the second pad region 2102 on the first base substrate 110 overlaps with the first pad region 1102.

In some embodiments, as illustrated by FIG. 2, the first filter substrate 100 further includes a first sealing structure 150, arranged around the first resonator 120, the first electrode pad 130 and the first auxiliary pad 140; the second filter substrate 200 further includes a second sealing structure 250, arranged around the second resonator 220, the second electrode pad 230 and the second auxiliary pad 240, and the second sealing structure 250 is arranged in contact with the first sealing structure 150, so as to seal the cavity 350 between the first filter substrate 100 and the second filter substrate 200.

In some embodiments, as illustrated by FIG. 2, a distance between the surface of the first sealing structure 150 away from the first base substrate 110 and the first back surface 110B of the first base substrate 110 is equal to a distance between the surface of the first electrode pad 130 away from the first base substrate 110 and the first back surface 110B of the first base substrate 110. Therefore, it can be ensured that all the first electrode pads and the second auxiliary pads are bonded or in contact with each other, and all the second electrode pads and the first auxiliary pads are bonded or in contact with each other.

In some embodiments, as illustrated by FIG. 2, FIG. 4 and FIG. 5, the first sealing structure 150 is a ring-shaped conductive structure surrounding the first resonator 120, the first electrode pad 130 and the first auxiliary pad 140, and the first sealing structure 150, the first electrode pad 130 and the first auxiliary pad 140 are formed on a same conductive layer and in a same patterning process.

In some embodiments, as illustrated by FIG. 2, FIG. 4 and FIG. 5, a distance between the surface of the second sealing structure 250 away from the second base substrate 210 and the second back surface 210B of the second base substrate 210 is equal to a distance between the surface of the electrode pad 230 away from the second base substrate 210 and the second back surface 210B of the second base substrate 210. Therefore, it can be ensured that all the first electrode pads and the second auxiliary pads are bonded or in contact with each other, and all the second electrode pads and the first auxiliary pads are bonded or in contact with each other.

In some embodiments, as illustrated by FIG. 2, FIG. 4 and FIG. 5, the second sealing structure 250 is a ring-shaped conductive structure surrounding the second resonator 220, the second electrode pad 230 and the second auxiliary pad 240, and the second sealing structure 250, the second electrode pad 230 and the second auxiliary pad 240 are formed on a same conductive layer and in a same patterning process.

In some embodiments, as illustrated by FIG. 4 and FIG. 5, the first filter substrate 100 further includes a first ground pad 160, and the first ground pad 160 is connected to the first sealing structure 150; the second filter substrate 200 further includes a second ground pad 260, and the second ground pad 260 is connected to the second sealing structure.

Figure 6:
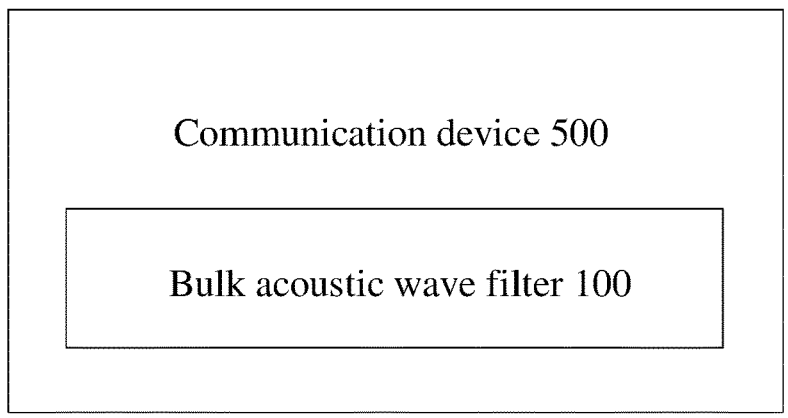
FIG. 6 is a schematic diagram of a communication device according to an embodiment of the present disclosure.

At least one embodiment of the present disclosure further provides a communication device. FIG. 6 is a schematic diagram of a communication device according to an embodiment of the present disclosure. As illustrated FIG. 6, the communication device 500 includes the bulk acoustic wave filter 300 provided in any of the above embodiments. Because the communication device 500 includes the above-mentioned the bulk acoustic wave filter 300, the communication device 500 also has the advantages of low cost and high integration.

In some embodiments, the above-mentioned communication device is a radio frequency front-end module. Because the radio frequency front-end module usually includes a plurality of (6-10) filters, the radio frequency front-end module adopts the bulk acoustic wave filter provided in any of the above embodiments, and the bulk acoustic wave filter integrates two filter substrates in a direction perpendicular to the first base substrate, the radio frequency front-end module further has advantages of small size and so on.

In some embodiments, the above-mentioned communication device may further include electronic products with communication functions, for example a mobile phone, a tablet computer, a navigator, and the like.

Figure 7:
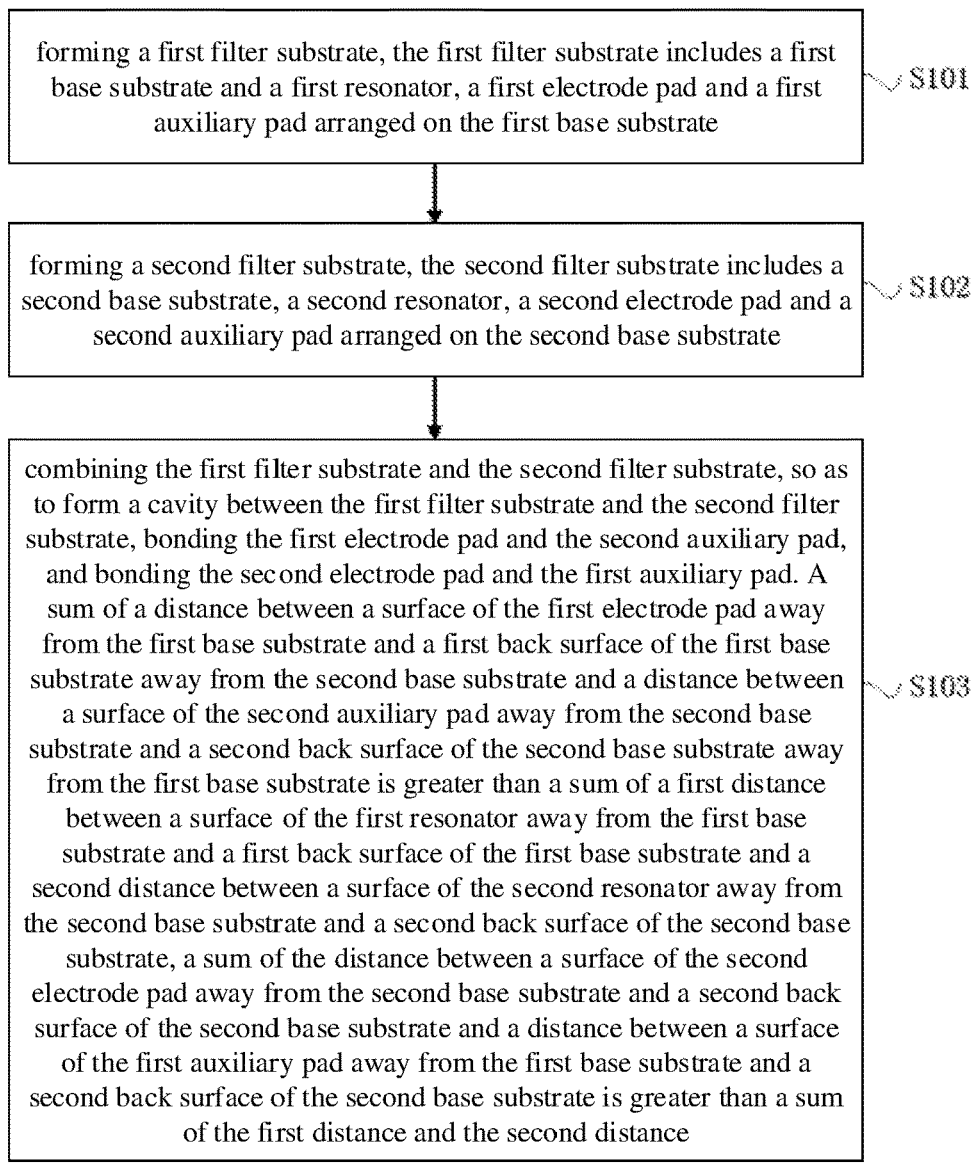
FIG. 7 is a flowchart of a manufacturing method of a bulk acoustic wave filter according to an embodiment of the present disclosure.

At least one embodiment of the present disclosure further provides a manufacturing method of a bulk acoustic wave filter. FIG. 7 is a flowchart of a manufacturing method of a bulk acoustic wave filter according to an embodiment of the present disclosure. FIG. 8A-FIG. 8G is a schematic diagram of the steps for manufacturing a bulk acoustic wave filter according to an embodiment of the present disclosure. As illustrated by FIG. 7, the manufacturing method for the bulk acoustic wave filter includes the following steps S101-S103.

Step S101: forming a first filter substrate, the first filter substrate includes a first base substrate and a first resonator, a first electrode pad and a first auxiliary pad arranged on the first base substrate.

Figure 8A:
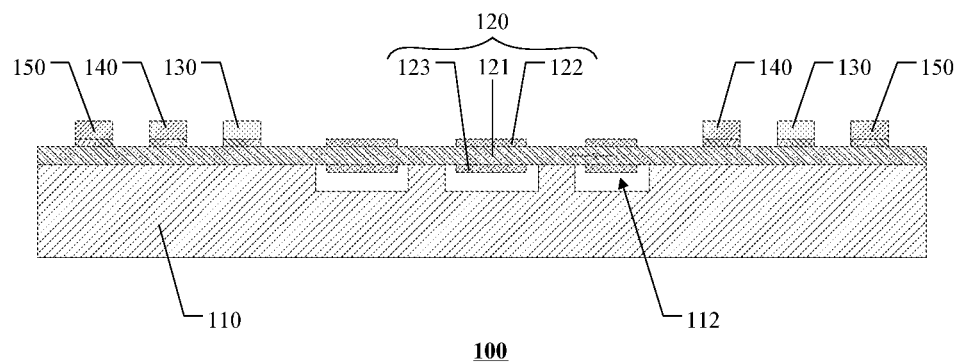
FIG. 8A-FIG. 8G is schematic diagrams of the steps for manufacturing a bulk acoustic wave filter according to an embodiment of the present disclosure.

For example, as illustrated by FIG. 8A, a first filter substrate 100 includes a first base substrate 110 and a first resonator 120, a first electrode pad 130 and a first auxiliary pad 140 on the first base substrate 110.

Step S102: forming a second filter substrate, the second filter substrate includes a second base substrate, a second resonator, a second electrode pad and a second auxiliary pad arranged on the second base substrate.

Figure 8B:
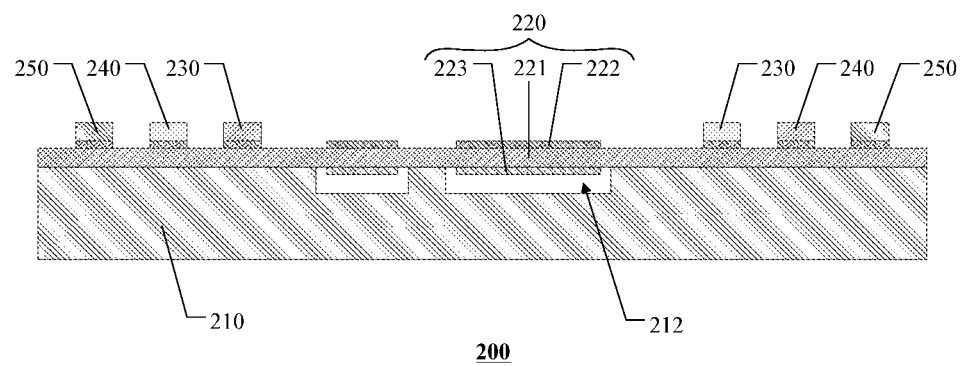

For example, as illustrated by FIG. 8B, a second filter substrate 200 includes a second base substrate 210, and a second resonator 220, a second electrode pad 230 and a second auxiliary pad 240 are arranged on the second base substrate 210.

Step S103: combining the first filter substrate and the second filter substrate, so as to form a cavity between the first filter substrate and the second filter substrate, bonding the first electrode pad and the second auxiliary pad, and bonding the second electrode pad and the first auxiliary pad. A sum of a distance between a surface of the first electrode pad away from the first base substrate and a first back surface of the first base substrate away from the second base substrate and a distance between a surface of the second auxiliary pad away from the second base substrate and a second back surface of the second base substrate away from the first base substrate is greater than a sum of a first distance between a surface of the first resonator away from the first base substrate and a first back surface of the first base substrate and a second distance between a surface of the second resonator away from the second base substrate and a second back surface of the second base substrate, a sum of the distance between a surface of the second electrode pad away from the second base substrate and a second back surface of the second base substrate and a distance between a surface of the first auxiliary pad away from the first base substrate and a second back surface of the second base substrate is greater than a sum of the first distance and the second distance.

Figure 8C:
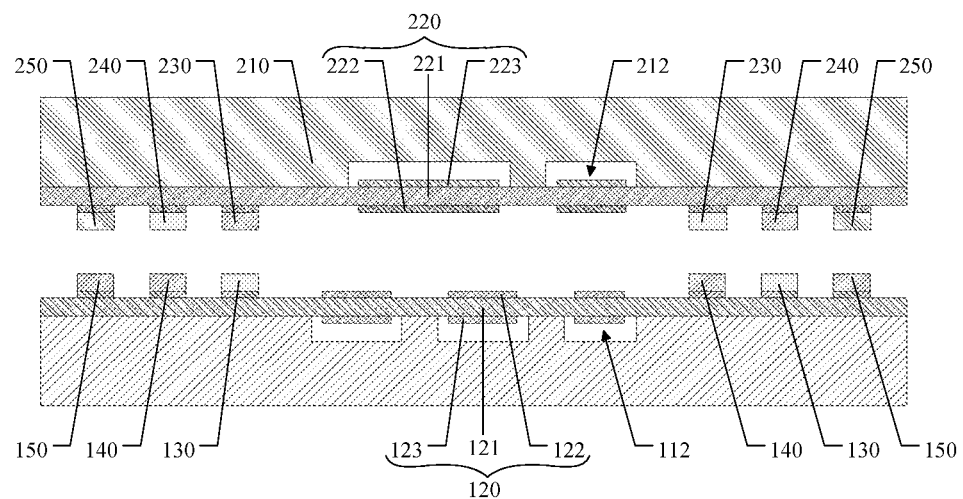
Figure 8D:
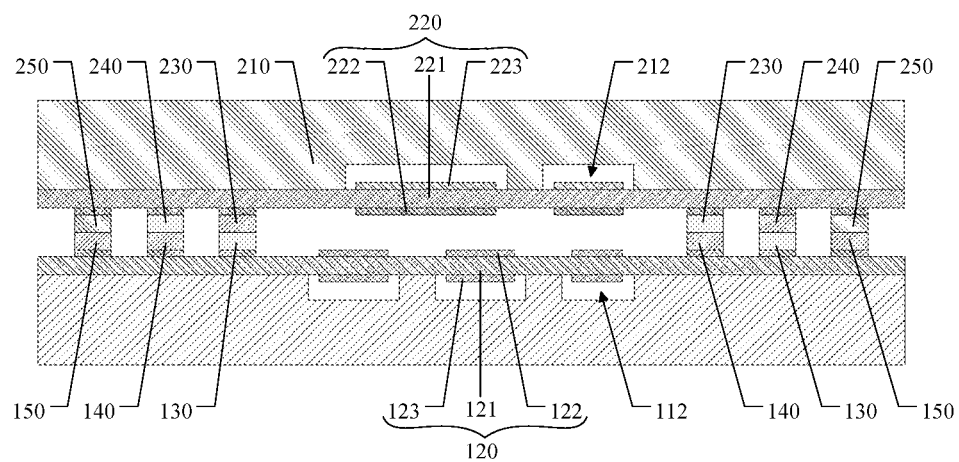

For example, as illustrated by FIG. 8C and FIG. 8D, vertically bonding the first filter substrate 100 and the second filter substrate 200 to form a cavity between the first filter substrate 100 and the second filter substrate 200, bonding the first electrode pad 130 and the second auxiliary pad 240, and bonding the second electrode pad 230 and the first auxiliary pad 140. A sum of a distance H1 between a surface of the first electrode pad 130 away from the first base substrate 110 and a first back surface 110B of the first base substrate 110 away from the second base substrate 210 and a distance H2 between a surface of the second auxiliary pad 240 away from the second base substrate 210 a distance H2 of a second back surface 210B of the second base substrate 210 away from the first base substrate 110 is greater than a sum of a first distance D1 between a surface of the first resonator 120 away from the first base substrate 110 and a first back surface 110B of the first base substrate 110 and a second distance D2 between a surface of the second resonator 220 away from the second base substrate 210 and a second back surface 210B of the second base substrate 210, that is: H1+H2>D1+D2. A sum of a distance H3 between a surface of the second electrode pad 230 away from the second base substrate 210 and the second back surface 210B of the second base substrate 210 and a distance H4 between a surface of the first auxiliary pad 140 away from the first base substrate 110 and the second back surface 210B of the second base substrate 210 is greater than the sum of the first distance D1 and the second distance D2, that is: H3+H4>D1+D2.

In the manufacturing method of the bulk acoustic wave filter provided by the embodiments of the present disclosure, the first filter substrate and the second filter substrate are vertically bonded to form a cavity between the first filter substrate and the second filter substrate, and the height H1 of the first electrode pad relative to the first back surface and the height H2 of the second auxiliary pad relative to the second back surface satisfy: H1+H2>D1+D2, the height H3 of the second electrode pad relative to the second back surface and the height H4 of the first auxiliary pad relative to the first back surface satisfy: H3+H4>D1+D2. Therefore, the first electrode pad and the second auxiliary pad can support and maintain the space between the first filter substrate and the second filter substrate, and the second electrode pad and the first auxiliary pad can support and maintain the space between the first filter substrate and the second filter substrate, thereby forming the cavity between the first filter substrate and the second filter substrate. On the one hand, the manufacturing method of the bulk acoustic wave filter makes the first filter substrate serve as a package cover for the second filter substrate, and makes the second filter substrate serve as a package cover for the first filter substrate, therefore, it is not needed to introduce other packaging structures for example additional cover wafers, bonded organic films or organic dry films to implement packaging, thereby greatly reducing the manufacturing cost of the bulk acoustic wave filter. On the other hand, the bulk acoustic wave filter integrates two filter substrates into one, so as to provide filter products of two frequency bands, so has a high degree of integration, and further reduce the volume of the radio frequency front-end module using a plurality of filters. In addition, because the first filter substrate is provided with the first auxiliary pad in addition to the first electrode pad, and the second filter substrate is further provided with the second auxiliary pad in addition to the second electrode pad, the manufacturing method of the bulk acoustic wave filter actually increases the number of pads on the first filter substrate and the second filter substrate and the number of through holes or a solder ball for electrical connection to outside, thereby improving the thermal conductivity of the bulk acoustic wave filter.

In some embodiments, it is possible to adopt a vertical bonding method to bond the first filter substrate and the second filter substrate.

For example, as illustrated by FIG. 8C and FIG. 8D, the first electrode pad 130 includes a first sub-electrode layer 130*a* and a second sub-electrode layer 130*b*, and the second sub-electrode layer 130*b* is arranged on a side of the first sub-electrode layer 130*a* away from the first base substrate the substrate 110. The first sub-electrode layer 130*a* may be made of a material with better adhesion to the first base substrate 110 or a first piezoelectric layer 121, and the second sub-electrode layer 130*b* may be made of a material with better bonding properties. At the same time, the second auxiliary pad 240 includes a third sub-auxiliary layer 240*a* and a fourth sub-auxiliary layer 240*b*, and the fourth sub-auxiliary layer 240*b* is arranged on a side of the third sub-auxiliary layer 240*a* away from the first base substrate 110. The third sub-auxiliary layer 240*a* may be made of a material with better adhesion to the second base substrate 210 or the second piezoelectric layer 221, and the fourth sub-auxiliary layer 240*b* may be made of a material with better bonding performance Therefore, by bonding the first electrode pad and the second auxiliary pad, the first filter substrate and the second filter substrate are bonded. Moreover, because both the second sub-electrode layer and the fourth sub-auxiliary layer are made of materials with better bonding properties, better bonding can be achieved; in addition, the first sub-electrode layer and the third sub-auxiliary layer have relatively better adhesion performance, the first filter substrate and the second filter substrate can be more firmly bonded.

For example, as illustrated by FIG. 8C and FIG. 8D, the first auxiliary pad 140 includes a first sub-auxiliary layer 140*a* and a second sub-auxiliary layer 140*b*, and the second sub-auxiliary layer 140*b* is arranged on a side of the first sub-auxiliary layer 140*a* away from the first base substrate 110. The first sub-auxiliary layer 140*a* may be made of the material with better adhesion performance to the first base substrate 110 or the first piezoelectric layer 121, and the second sub-auxiliary layer 140*b* may be made of the material with better bonding performance. At the same time, the second electrode pad 230 includes a third sub-electrode layer 230*a* and a fourth sub-electrode layer 230*b*, and the fourth sub-electrode layer 230*b* is arranged on a side of the third sub-electrode layer 230*a* away from the second base substrate 210. The third sub-electrode layer 230*a* may be made of a material with better adhesion performance to the second base substrate 210 or the second piezoelectric layer 221, and the fourth sub-electrode layer 230*b* may be made of a material with better bonding performance. Therefore, by bonding the first auxiliary pad and the second electrode pad, the first filter substrate and the second filter substrate are bonded. Moreover, because both the fourth sub-electrode layer and the second sub-auxiliary layer are made of materials with better bonding performance, better bonding can be achieved; in addition, the third sub-electrode layer and the fourth sub-auxiliary layer have relatively better adhesion performance, the first filter substrate and the second filter substrate can be more firmly bonded.

In some embodiments, as illustrated by FIG. 8A, the first resonator 120 includes the first piezoelectric layer 121, a first upper electrode 122 and a first lower electrode 123; the first base substrate 110 includes the first groove 112, the first groove 112 is recessed into the first base substrate 110 from the surface of the first base substrate 110 close to the second base substrate 210; the first piezoelectric layer 121 spans the first groove 112, the first lower electrode 123 is arranged within the first groove 112, and the first upper electrode 122 is arranged on the side of the first piezoelectric layer 121 away from the first lower electrode 123.

In some embodiments, as illustrated by FIG. 8B, the second resonator 220 includes the second piezoelectric layer 221, a second upper electrode 222 and a second lower electrode 223, the second base substrate 210 includes a second groove 212, the second groove 212 is recessed into the second base substrate 210 from a surface of the second base substrate 210 close to the first base substrate 110; the second piezoelectric layer 221 spans the second groove 212, the second lower electrode 223 is arranged within the second groove 212, and the second upper electrode 222 is arranged on a side of the second piezoelectric layer 221 away from the second lower electrode 223.

In some embodiments, the first base substrate is a wafer and the second base substrate is a wafer. Of course, the embodiments of the present disclosure include, but are not limited to thereto, the first base substrate and the second base substrate can also be made of other materials.

In some embodiments, the height H1 of the first electrode pad relative to the first back surface and the height H2 of the second auxiliary pad relative to the second back surface satisfy: H1+H2>D1+D2+2 μm, and the height H3 of the second electrode pad relative to the second back surface and the height H4 of the first auxiliary pad relative to the first back surface satisfy: H3+H4>D1+D2+2 μm. Therefore, the manufacturing method of a bulk acoustic wave filter can better prevent the first resonator and the second resonator from touching in the working state.

In some embodiments, the distance between the surface of the first electrode pad away from the first base substrate and the first back surface of the first base substrate and the distance between the surface of the first auxiliary pad away from the first base substrate and the first back surface of the first base substrate are both greater than the first distance. Therefore, after the first filter substrate and the second filter substrate are vertically bonded, the first filter substrate and the second filter substrate better form the cavity between the first resonator and the second resonator.

In some embodiments, the distance between the surface of the second electrode pad away from the second base substrate and the second back surface of the second base substrate and the distance between the surface of the second auxiliary pad away from the second base substrate and the second back surface of the second base substrate are both greater than the second distance. Therefore, after the first filter substrate and the second filter substrate are vertically bonded, the first filter substrate and the second filter substrate better form the cavity between the first resonator and the second resonator.

In some embodiments, the distance between the surface of the first electrode pad away from the first base substrate and the first back surface of the first base substrate is equal to the distance between the surface of the first auxiliary pad away from the first base substrate and the first back surface of the first base substrate. In this way, on the one hand, all the first electrode pads and the second auxiliary pads are bonded or in contact with each other, and all the second electrode pads and the first auxiliary pads are bonded or contacted; On the one hand, the first electrode pad and the first auxiliary pad are formed in the same conductive layer and in the same patterning process, so that the manufacturing cost of the first electrode pad and the first auxiliary pad are reduced.

In some embodiments, the distance between the surface of the second electrode pad away from the second base substrate and the second back surface of the second base substrate is equal to the distance between the surface of the second auxiliary pad away from the second base substrate and the second back surface of the second base substrate. In this way, on the one hand, all the first electrode pads and the second auxiliary pads are bonded or in contact with each other, and all the second electrode pads and the first auxiliary pads are bonded or in contact with each other; on the one hand, the second electrode pad and the second auxiliary pad are formed in the same conductive layer and in the same patterning process, so that the manufacturing cost of the second electrode pad and the second auxiliary pad are reduced.

In some examples, the manufacturing method of the bulk acoustic wave filter further includes thinning the second base substrate from a side of the second base substrate away from the first base substrate; and forming a plurality of through holes in the second base substrate, the orthographic projection of the through holes on the second base substrate overlaps the orthographic projection of the second electrode pad and the second auxiliary pad on the second base substrate, thereby facilitating the connection of the second electrode pad and the second auxiliary pad with the external circuit.

Figure 8E:
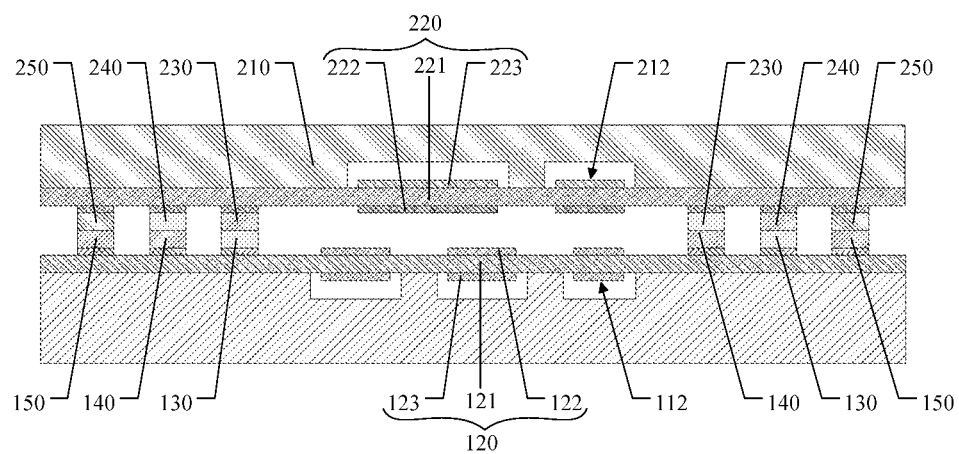

For example, as illustrated by FIG. 8E, thinning the second base substrate 210 from the side of the second base substrate 210 away from the first base substrate 110.

Figure 8F:
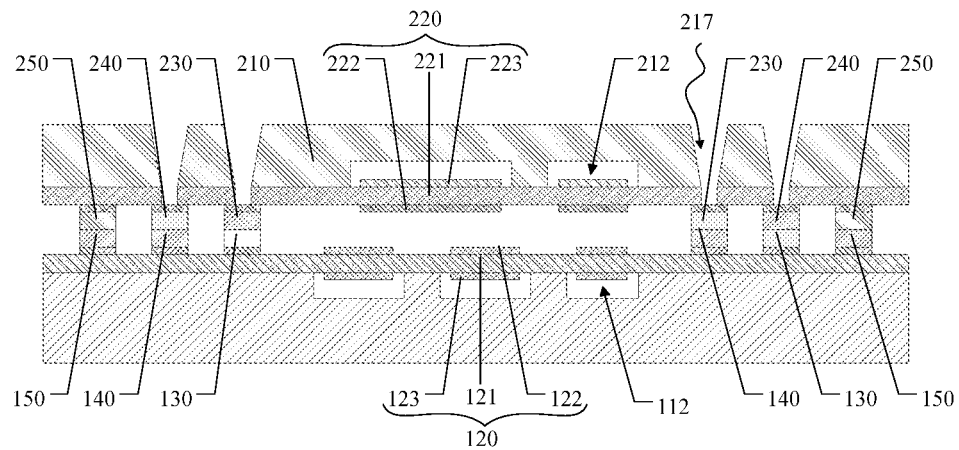

For example, as illustrated by FIG. 8F, forming a plurality of through holes 217 penetrating the second base substrate 210 in the second base substrate 210. The orthographic projections of the plurality of through holes 217 on the second base substrate 210 overlap with the orthographic projections of the second electrode pads 230 and the second auxiliary pads 240 on the second base substrate 210.

In some embodiments, the manufacturing method of the bulk acoustic wave filter further includes: forming an electrical connection layer on a side of the second base substrate away from the first base substrate, where the electrical connection layer is at least partially arranged within the plurality of through holes; forming a passivation layer on a side of the electrical connection layer away from the second base substrate; patterning the passivation layer to form openings in the passivation layer; forming a solder ball (for example a tin solder ball) on a side of the passivation layer away from the second base substrate. Therefore, the electrical connection layer connects the second electrode pad and the second auxiliary pad to each other, or connects to external circuits through the solder ball.

Figure 8G:
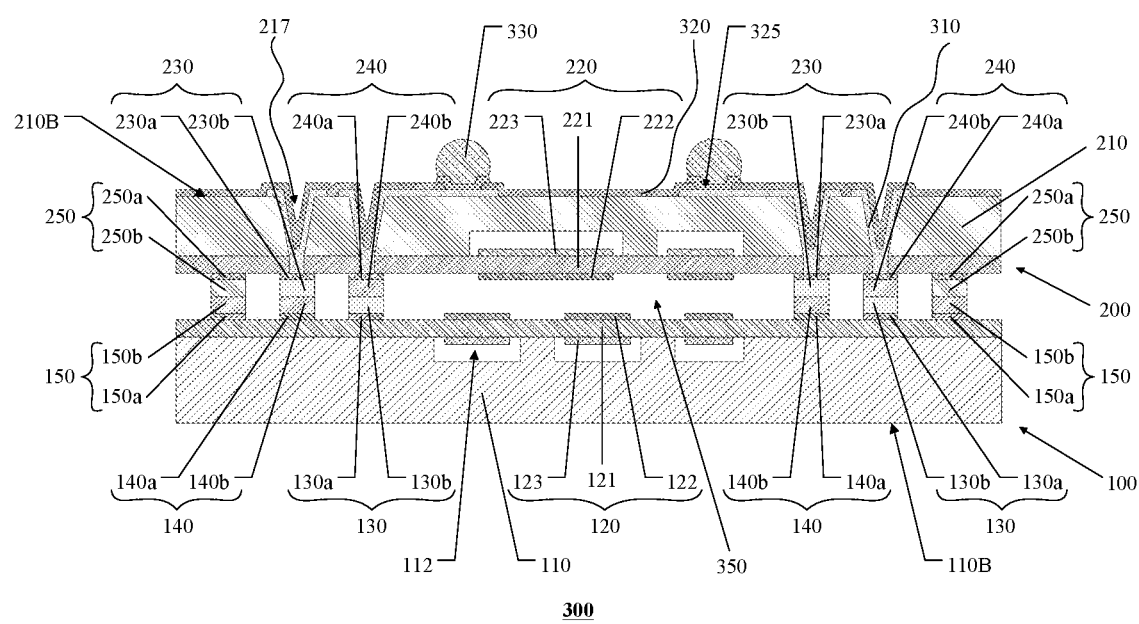

For example, as illustrated by FIG. 8G, forming an electrical connection layer 310 on a side of the second base substrate 210 away from the first base substrate 110, and where the electrical connection layer 310 is at least partially arranged within the plurality of through holes 217; forming a passivation layer 320 on a side of the electrical connection layer 310 away from the second base substrate 210; patterning the passivation layer 320 to form a passivation layer opening 325; forming a solder ball on a side of the passivation layer 325 away from the second base substrate 210 (for example a tin solder ball).

The following points need to be explained:

(1) In the drawings of the embodiments of the present disclosure, only the structures related to the embodiments of the present disclosure are involved, and other structures can refer to the general design.

(2) The features of the same embodiment and different embodiments of the present disclosure can be combined with each other without conflict.

The above are only the specific embodiments of this disclosure, but the scope of protection of this disclosure is not limited to this. Any person familiar with this technical field can easily think of changes or substitutions within the technical scope disclosed in this disclosure, which should be covered by the scope of protection of this disclosure. Therefore, the scope of protection of this disclosure should be based on the scope of protection of the claims.

What is claimed is:

1. A bulk acoustic wave filter, comprising:
a first filter substrate, comprising a first base substrate and a first resonator, a first electrode pad and a first auxiliary pad arranged on the first base substrate; and
a second filter substrate, comprising a second base substrate and a second resonator, a second electrode pad and a second auxiliary pad arranged on the second base substrate,
wherein the first filter substrate is arranged opposite to the second filter substrate, the first electrode pad and the second auxiliary pad are in contact with each other, and the second electrode pad and the first auxiliary pad are in contact with each other,
a sum of a distance between a surface of the first electrode pad away from the first base substrate and a first back surface of the first base substrate away from the second base substrate and a distance between a surface of the second auxiliary pad away from the second base substrate and a second back surface of the second base substrate away from the first base substrate is greater than a sum of a first distance between a surface of the first resonator away from the first base substrate and the first back surface of the first base substrate and a second distance between a surface of the second resonator away from the second base substrate and the second back surface of the second base substrate,
a sum of a distance between a surface of the second electrode pad away from the second base substrate and the second back surface of the second base substrate and a distance between a surface of the first auxiliary pad away from the first base substrate and the first back surface of the first base substrate is greater than the sum of the first distance and the second distance.

2. The bulk acoustic wave filter according to claim 1, wherein the first resonator and the second resonator are spaced apart in a direction perpendicular to the first base substrate.

3. The bulk acoustic wave filter according to claim 1, wherein the distance between the surface of the first electrode pad away from the first base substrate and the first back surface of the first base substrate and the distance between the surface of the first auxiliary pad away from the first base substrate and the first back surface of the first base substrate are both greater than the first distance.

4. The bulk acoustic wave filter according to claim 3, wherein the distance between the surface of the first electrode pad away from the first base substrate and the first back surface of the first base substrate is equal to the distance between the surface of the first auxiliary pad away from the first base substrate and the first back surface of the first base substrate.

5. The bulk acoustic wave filter according to claim 1, wherein the distance between the surface of the second electrode pad away from the second base substrate and the second back surface of the second base substrate and the distance between the surface of the second auxiliary pad away from the second base substrate and the second back surface of the second base substrate are both greater than the second distance.

6. The bulk acoustic wave filter according to claim 5, wherein the distance between the surface of the second electrode pad away from the second base substrate and the second back surface of the second base substrate is equal to the distance between the surface of the second auxiliary pad away from the second base substrate and the second back surface of the second base substrate.

7. The bulk acoustic wave filter according to claim 1, wherein the first resonator comprises a first piezoelectric layer, a first upper electrode and a first lower electrode, the first base substrate comprises a first groove,
the first piezoelectric layer spans the first groove, the first lower electrode is arranged on a side of the first piezoelectric layer close to the first base substrate, and the first upper electrode is arranged on a side of the first piezoelectric layer away from the first lower electrode.

8. The bulk acoustic wave filter according to claim 7, wherein a thickness of the first electrode pad and a thickness of the first auxiliary pad are both greater than a thickness of the first upper electrode.

9. The bulk acoustic wave filter according to claim 1, wherein the second resonator comprises a second piezoelectric layer, a second upper electrode and a second lower electrode, the second base substrate comprises a second groove,
the second piezoelectric layer spans the second groove, and the second lower electrode is arranged on a side of the second piezoelectric layer close to the second base substrate, and the second upper electrode is arranged on a side of the second piezoelectric layer away from the second lower electrode.

10. The bulk acoustic wave filter according to claim 9, wherein a thickness of the second electrode pad and a thickness of the second auxiliary pad are both greater than a thickness of the second upper electrode.

11. The bulk acoustic wave filter according to claim 1, wherein the first base substrate comprises a first resonator region and a first pad region arranged around the first resonator region, and the first resonator is arranged in the first resonator region, the first electrode pad and the first auxiliary pad are arranged in the first pad region,
the second base substrate comprises a second resonator region and a second pad region arranged around the second resonator region, the second resonator is arranged in the second resonator region, and the second electrode pad and the second auxiliary pad are arranged in the second pad region,
an orthographic projection of the second pad region on the first base substrate overlaps with the first pad region.

12. The bulk acoustic wave filter according to claim 1, wherein the first base substrate is a wafer, and the second base substrate is a wafer.

13. The bulk acoustic wave filter according to claim 1, wherein an orthographic projection of the second resonator on the first base substrate overlaps with an orthographic projection of the first resonator on the first base substrate.

14. The bulk acoustic wave filter according to claim 1, wherein an orthographic projection of the second electrode pad on the first base substrate overlaps with an orthographic projection of the first auxiliary pad on the first base substrate, and an orthographic projection of the second auxiliary pad on the first base substrate overlaps with an orthographic projection of the first electrode pad on the first base substrate.

15. The bulk acoustic wave filter according to claim 1, wherein the first filter substrate further comprises a first sealing structure, arranged around the first resonator, the first electrode pad and the first auxiliary pad; the second filter substrate further comprises a second sealing structure, arranged around the second resonator, the second electrode pad and the second auxiliary pad, and the second sealing structure is arranged in contact with the first sealing structure.

16. The bulk acoustic wave filter according to claim 15, wherein the first sealing structure, the first electrode pad and the first auxiliary pad are formed on a same conductive layer and in a same patterning process,
the second sealing structure, the second electrode pad and the second auxiliary pad are formed on a same conductive layer and in a same patterning process.

17. The bulk acoustic wave filter according to claim 1, wherein the second base substrate comprises a plurality of through holes penetrating the second base substrate,
the bulk acoustic wave filter further comprises an electrical connection layer, which is at least partially arranged within the plurality of through holes, orthographic projections of the plurality of through holes on the second base substrate overlap with orthographic projections of the second electrode pads and the second auxiliary pads on the second base substrate, the electrical connection layer is connected to the second electrode pad and the second auxiliary pad.

18. The bulk acoustic wave filter according to claim 17, wherein the bulk acoustic wave filter further comprises a passivation layer, arranged on a side of the electrical connection layer away from the second base substrate, which comprises a passivation layer opening, the passivation layer opening exposing part of the electrical connection layer; and
a solder ball, connected to the electrical connection layer through the passivation layer opening.

19. A communication device, comprising the bulk acoustic wave filter according to claim 1.

20. A manufacturing method of a bulk acoustic wave filter, comprising:
forming a first filter substrate, the first filter substrate comprises a first base substrate and a first resonator, a first electrode pad and a first auxiliary pad arranged on the first base substrate;
forming a second filter substrate, the second filter substrate comprises a second base substrate, a second resonator, a second electrode pad and a second auxiliary pad arranged on the second base substrate; and
combining the first filter substrate and the second filter substrate, so as to form a cavity between the first filter substrate and the second filter substrate,
wherein a sum of a distance between a surface of the first electrode pad away from the first base substrate and a first back surface of the first base substrate away from the second base substrate and a distance between a surface of the second auxiliary pad away from the second base substrate and a second back surface of the second base substrate away from the first base substrate is greater than a sum of a first distance between a surface of the first resonator away from the first base substrate and a first back surface of the first base substrate and a second distance between a surface of the second resonator away from the second base substrate and a second back surface of the second base substrate,
a sum of the distance between a surface of the second electrode pad away from the second base substrate and a second back surface of the second base substrate and a distance between a surface of the first auxiliary pad away from the first base substrate and a second back surface of the second base substrate is greater than a sum of the first distance and the second distance.

\* \* \* \* \*